United States Patent [19]
Takahashi et al.

[11] 3,964,046
[45] June 15, 1976

[54] CONTROL DEVICE FOR A PORTABLE MACHINE

[75] Inventors: Kiyoshi Takahashi, Kunitachi; Noritsugu Hirata, Yokohama, both of Japan

[73] Assignee: Canon Kabushiki Kaisha, Tokyo, Japan

[22] Filed: May 20, 1974

[21] Appl. No.: 471,560

Related U.S. Application Data

[63] Continuation of Ser. No. 184,691, Sept. 29, 1971, abandoned.

[30] Foreign Application Priority Data

Oct. 2, 1970 Japan.............................. 45-86941
Oct. 2, 1970 Japan.............................. 45-98497

[52] U.S. Cl............................. 340/309.1; 340/266; 325/396; 250/200
[51] Int. Cl.².......................................... G08B 1/00
[58] Field of Search...................... 340/309.1–309.6, 340/263, 266; 325/395, 396; 250/200; 58/16

[56] References Cited
UNITED STATES PATENTS

| | | |
|---|---|---|
| 3,361,973 | 1/1968 | Wyjong.............................. 325/396 |
| 3,540,026 | 11/1970 | Scott........................... 340/309.1 X |
| 3,636,549 | 1/1972 | Berman........................... 340/309.1 |

*Primary Examiner*—John W. Caldwell
*Assistant Examiner*—William M. Wannisky
*Attorney, Agent, or Firm*—Toren, McGeady and Stanger

[57] ABSTRACT

A control device repeatedly starts operation of a portable machine by detecting the movement of a hand on a watch mechanism and producing a first start signal to start operation of one portion of the portable machine. A delay arrangement then produces a second start signal to actuate the remainder of the portable machine. A timing device, actuated by the first start signal, stops operation of the machine before occurrence of another first starting signal.

9 Claims, 11 Drawing Figures

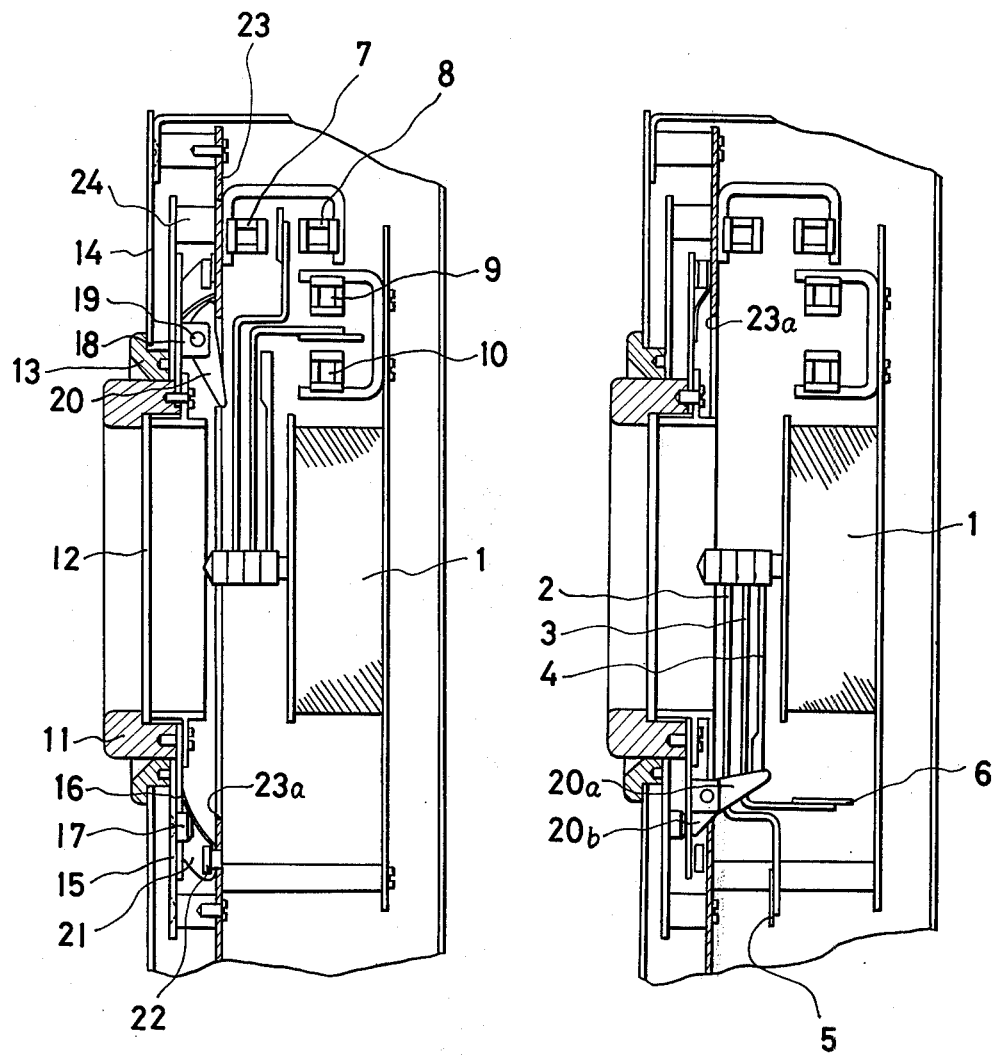

FIG.10
FIG.11
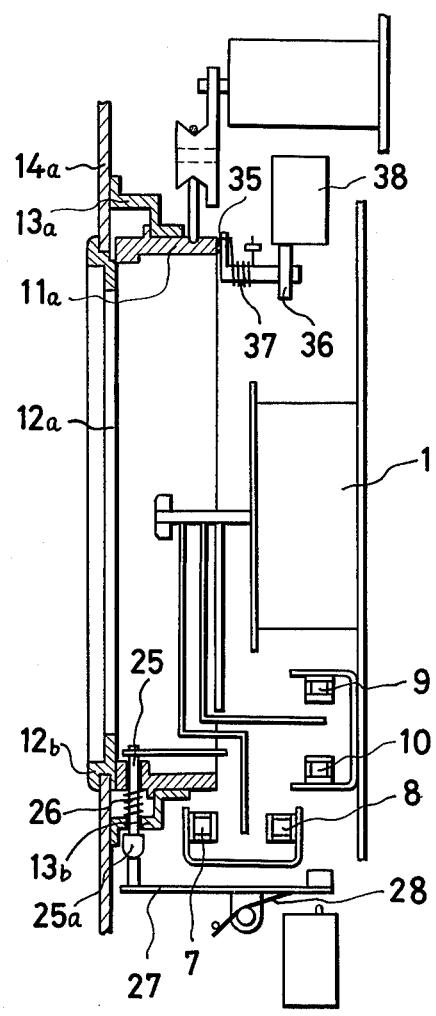
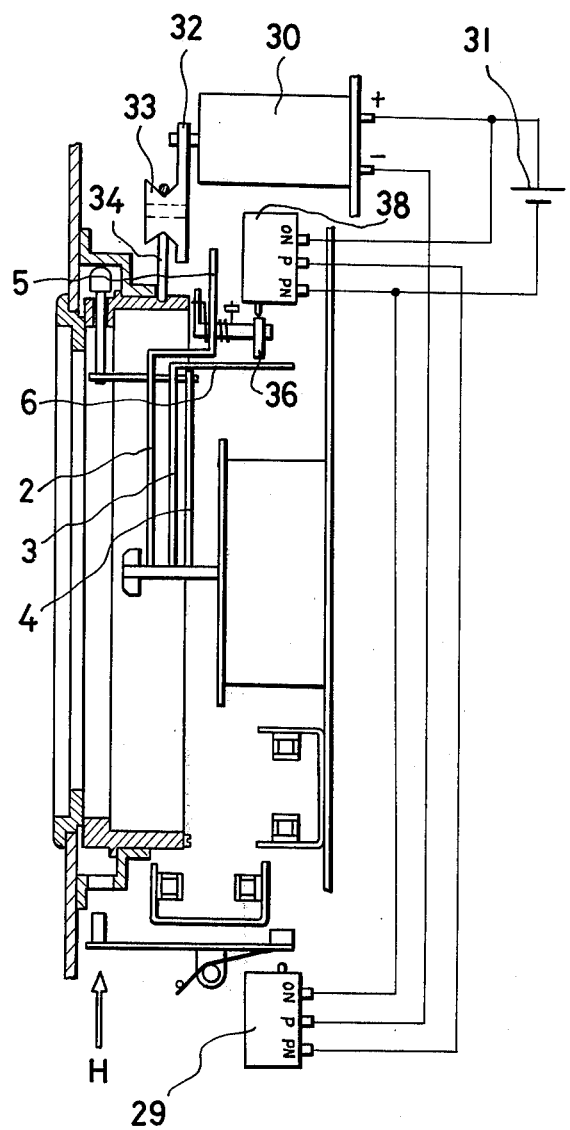

CONTROL DEVICE FOR A PORTABLE MACHINE

This is a continuation of application Ser. No. 184,691 filed Sept. 29, 1971, and now abandoned.

The present invention relates to a control device for a portable machine, such as a cinematographic camera a still camera or a tape-recorder, adapted to start its operation after a specified time internal, and to stop its operation a certain constant time after the start of its operation.

Various kinds of such control devices have been hitherto available. In conventional devices the operation starting signal usually has intervals of several tens of minutes at most. In order to elongate the signal internal some devices have been proposed which is provided with an synchronous motor driven by a commercial AC source. These conventional devices are very inconvenient particularly with respect to their portability.

The present invention overcomes the above inconvenience, and according to the present invention the signal intervals can be selected over a broad range of from several minutes to several tens of hour with a high degree of accuracy. Further according to the present invention, a watch arrangement is used as a clock-signal generator to afford portability, and the device is easily operable by a battery serving as an energy source.

Although it is known to afford time control directly by detecting the movement of a magnet fixed to the hand of a clock, it is impossible to attain a time control in the order of minutes, because it is difficult to mount a magnet on the second hand due to the weight of the magnet.

According to the present invention a light weight metal piece is attached to the second hand to interupt a magnetic circuit or a light path, etc.

The present invention will be described referring to the attached drawings.

FIG. 6 and FIG. 7 show the cross-section of a watch means combined with a part of a detecting means in operation and in a restoring state respectively.

FIG. 10 and 11 show the cross-section of a similar means combined with a part of detecting means as shown in FIG. 6 and FIG. 7, except that the restoring is achieved by a motor.

Figure 1:
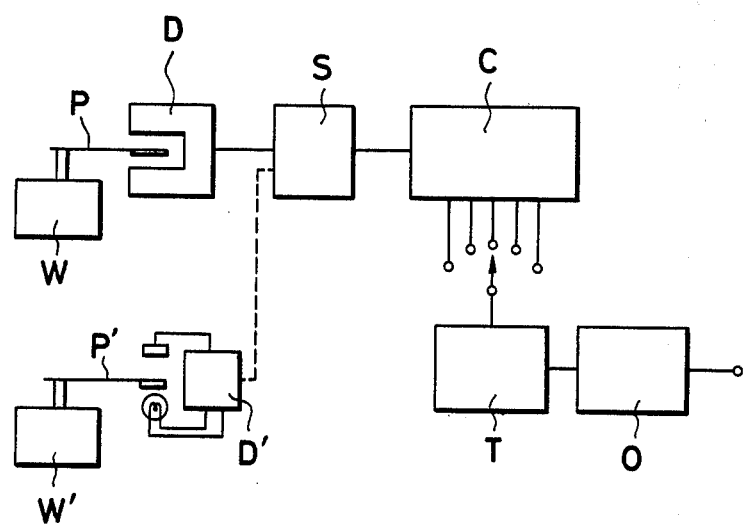
FIG. 1 is a block diagram of a device according to the present invention.

In FIG. 1, W(W') is a watch means, P(P') is a rotating painter connected to watch W(W'), D (D') is a detecting means, S is a wafeform shaping circuit, C is a counter circuit, T is a timer circuit, and O is an output controlling circuit for the operation of a portable machine. The dotted line in FIG. 1 means that either of the outputs from the detecting means D and the detecting means D' is supplied to the shaping circuit S.

The detecting means D detects a pass-through of a painter P of watch W at a certain paint in its rotation. The output signal from detector D is coupled to the shaping circuit S which, in turn, operates counter circuit C by the output from the shaping circuit S. Any desired signal interval shown in FIG. 2 by $t_1$, is preselected by changing a switch position at the output of the counter C.

Figure 2:
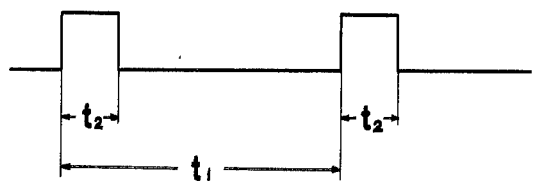
FIG. 2 shows the output from the device.

The time circuit T is triggered by the output from the counter circuit C and determines the operation signal delivering time shown in FIG. 2 by $t_2$.

Figure 3:
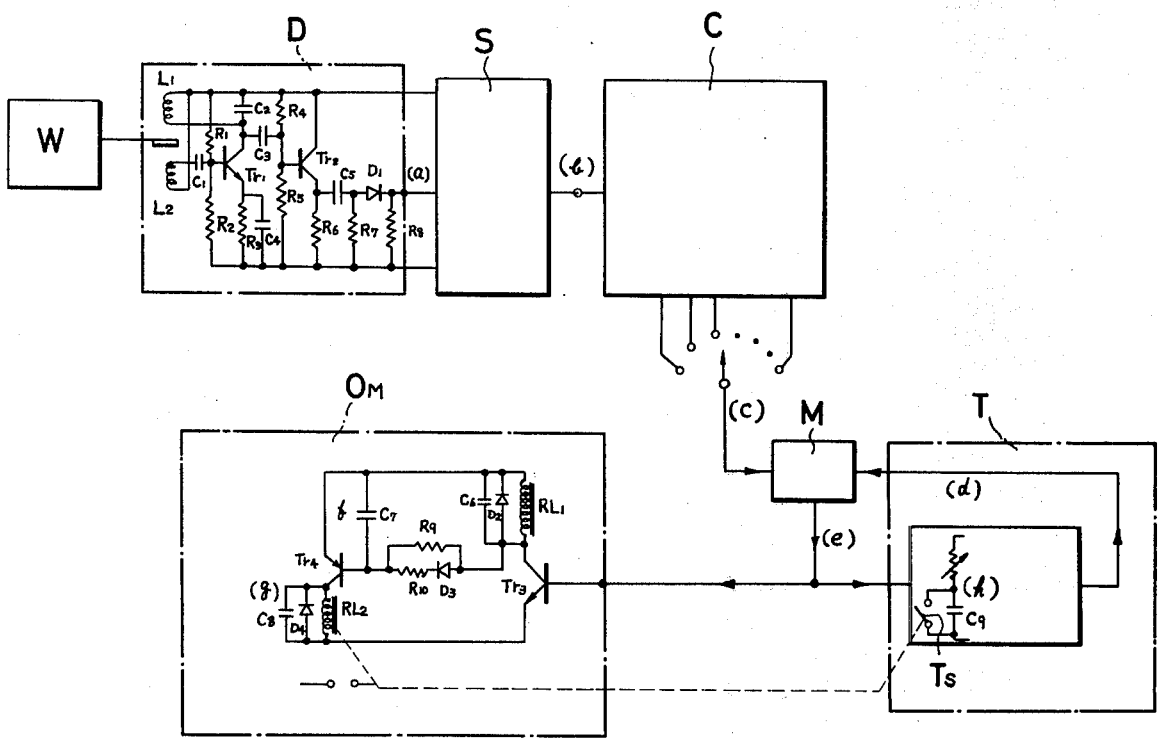
FIG. 3 is a circuit diagram of one embodiment of the device according to the present invention.

The circuit diagram shown in FIG. 3 is explained in connection with FIGS. 4 and 5. The explanation concerns mainly the differences between FIG. 1 and FIG. 3, where the reference characters designate like parts. $L_1$ and $L_2$ are detecting coils, $C_1$ to $C_5$ are capacitor provided in the detecting means D, $R_1$ to $R_8$ are resistors, $Tr_1$ and $Tr_2$ are transistors, and $D_1$ is a diode respectively provided in the detecting means D. M is a bi-stable multi-vibrator which receives an output from the counter circuit C and an output from the timer circuit T and delivers its output to the timer circuit T and to the output controlling means OM. The timer circuit T comprises a start switch $T_s$ and a variable resistor and a capacitor $C_9$ as its time constant circuit. The output controlling means OM comprises relay devices $RL_1$ and $RL_2$, the latter for controlling the start switch $T_s$ of the timer T. $TR_3$ and $TR_4$ are transistors, $C_6$ to $C_8$ are capacitor, $R_9$ and $R_{10}$ are resistors, $D_2$ to $L_4$ are diodes respectively provided in the output controlling means OM. The switch not designated in the output controlling means OM is provided as a power switch of the device.

Figure 4:
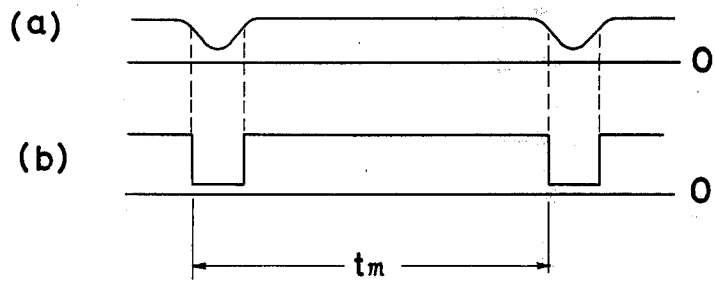
FIG. 4 shows wave forms from the detecting means and from the waveform shaping circuit respectively.

When the metal piece attached to the pointer for seconds of the watch W passes through the magnetic coupling between the detecting coils $L_1$ and $L_2$ of the detecting means D, the magnitude of the oscillation produced by the oscillator circuit composed of the transistor $TR_1$, the resistors $R_1$, $R_2$, and $R_3$, the capacitors $C_1$, $C_2$, and $C_4$, and the coils $L_1$ and $L_2$, is reduced, as shown in curve (a) of FIG. 4. Instead of the detecting coils $L_1$ and $L_2$, a light source and a CdS photo-sensitive element in detecting means D' may be provided as shown in FIG. 1. to interrupt the light path to produce an output a with a time interval tm. The shaping circuit S shapes the signal into a rectilinear wave from b with a corresponding time interval tm as shown in FIG. 4b. According to one embodiment of the invention, the shaping circuit S is in the form of a Schmitt trigger circuit. The output b of the shaping circuit S passes to the counter circuit C to count the number of output pulses to produce another rectilinear out-put c with any desired time interval $t_1$. The output c the triggers the bi-stable multi-vibrator M under the control of the output d from the time circuit T to hold the multi-vibrator M is a conductive state at its output e. This output e actuates the output controlling means Om and the transistor $TR_3$ turns on to energize the relay device $RL_1$. The relay device $RL_2$ is actuated with a delay time of $t_3$ after the actuation of the relay device $RL_1$ as shown by the wave form g because of the time constant circuit of the capacitor $C_7$ and the resistor $R_9$ and because of the lowered collector potential of the transistor $TR_3$. The relay device $RL_1$ may be used to bring another device for operation. For example the relay device $RL_1$ starts to illuminate a flood lamp to prepare for photography under illuminated condition. The relay device $RL_2$ controls the portable machine operation as well as the timer operation.

When the relay device $RL_2$ is energized, the timer circuit T starts its actuation of the wave form $h$ by the opening of the start switch Ts which has been connected across the capacitor $C_9$ of the time constant circuit of the variable resistor and the capacitor $C_9$ of the timer circuit T. Any operating period $t_4$ may be selected by varying the variable resistor of the time constant circuit. The output $d$ of the time circuit T resets the bi-stable multi-vibrator M from on to off. Under the reset condition, the output $e$ from the bistable multivibrator shifts from off to on to deenergize the relay device $RL_1$.

From the time of the denergization, the relay device $R_{12}$ approaches its deenergized state by the residual current through the transistor $TR_4$ which is controlled by discharge mainly through the time constant circuit of the capacitor $C_7$ and the resistor $R_{10}$ and the diode $D_3$. This time constant produces a shorter delay time $t_5$ between the deenergization of the relay device $RL_1$ and the relay device $RL_2$ than that for the energization of the relay device $RL_1$ and the $RL_2$. As shown by the waveform the charging time constant and discharge time constant are different because the time constant circuit having the capacitor $C_7$ the resistors $R_9$, $R_{10}$ and the diode $D_3$ is used. The delay time $t_3$ may be effectively used for recording and marks of the scene for example onto the film of the camera. The deenergization of the relay device $RL_2$ returns the start switch $T_s$ to its closed state. In this way, it is possible to repeat an automatic operation of operation time $t_4$ with a time interval of $t_1$.

Figure 5:
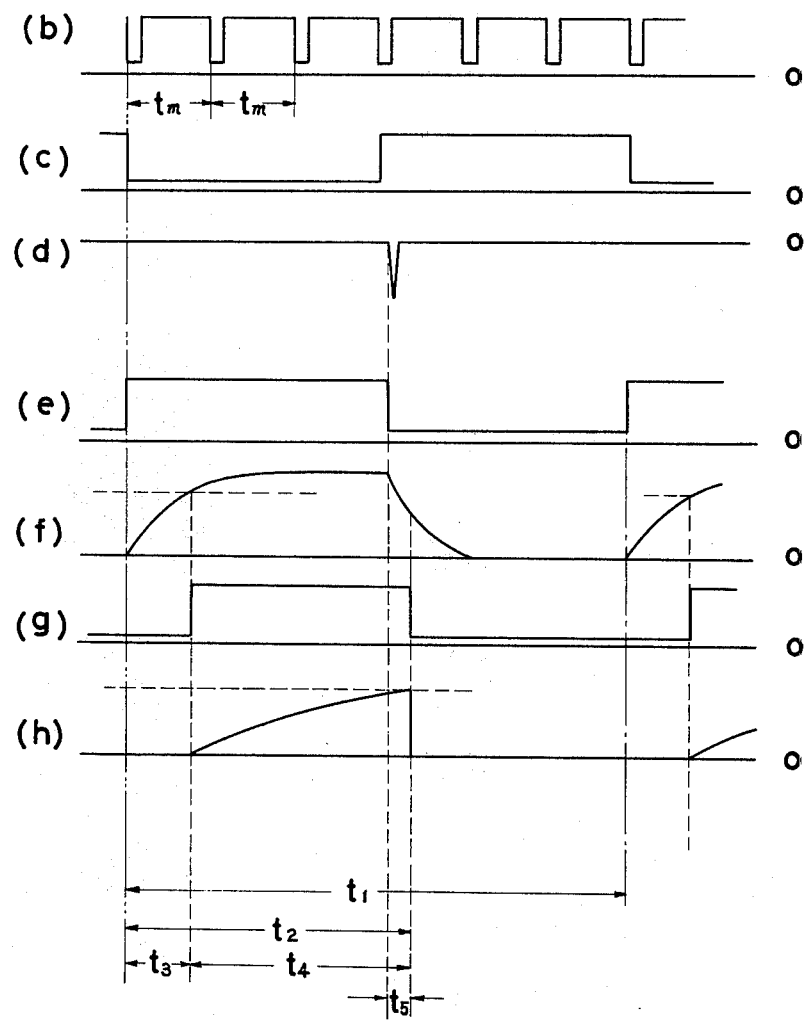
FIG. 5 shows wave forms of outputs at various points of the circuit diagram shown in FIG. 3.

Although in FIG. 3, the delay times $t_3$ and $t_5$ are pre-determined to get the actual operational time $t_4$ with the output controlling means OM, it is also possible to eliminate the delay times $t_3$ and $t_5$ so that the time interval $t_2$ in FIG. 5 corresponds to the operation time $t_2$ in FIG. 2.

Next referring to FIGS. 6 and 7, one example of the means for restoring the indicating member of the watch means to its original position will be explained.

1, 2, 3 and 4 are respectively a watch, a second hand, a minute hand and an hour hand. 5 and 6 are metal pieces attached to the end portion of the painters 2 and 3 respectively. 7, 8, and 9 and 10 are detecting coils for detecting the metal pieces 5 and 6. 11 is a ring-shaped member having a glass plate 12. 13 is a guide ring for member 11, fixed to a housing 14 of the timer through a front plate 15, support poles 24 and a rear plate 23. 17 are three nock pins located on the front plate 15 at constant angular distances of 120°, at different radial distance from the center. 16 IS a rotatable ring plate and has three holes positioned at corresponding positions to the pins 17. The ring plate 16 is pressed against the front plate 15 by a spring 21 secured to the rear plate 23 by fixing pins 22. A claw 20 is located on a bearing portion 18 affixed to ring plate 16 through a journal 19, and is rotatably supported in a rotatable manner in a radial direction. A portion 20b elastically contacts an arc shoulder 23a provided on the rear plate 23 by a spring not shown. The claw 20 does not contact of the pointers 2, 3 and 4 at the state shown in FIG. 6. When the member 11 is pressed down against the spring 21 in order to align the pointers 2, 3 and 4 at a particular angular position, the member 11 becomes rotatable because the pins 17 are disengaged from the holes provided on the ring plate 16. At this stage, one end 20d of the claw 20 goes until the other end 20b of the claw contacts the arc shoulder 23d to permit sweeping together of the pointers 2, 3 and 4 all together. Rotation of the member 11 in a predetermined direction sweeps the pointers 2, 3 and 4, positioned at any respective position and restores them % to their original positions, the engages holes of the ring plate 16 are again aligned with the pins 17 again so that the device shown in FIG. 7 is restored to the state shown in FIG. 6.

Figure 8:
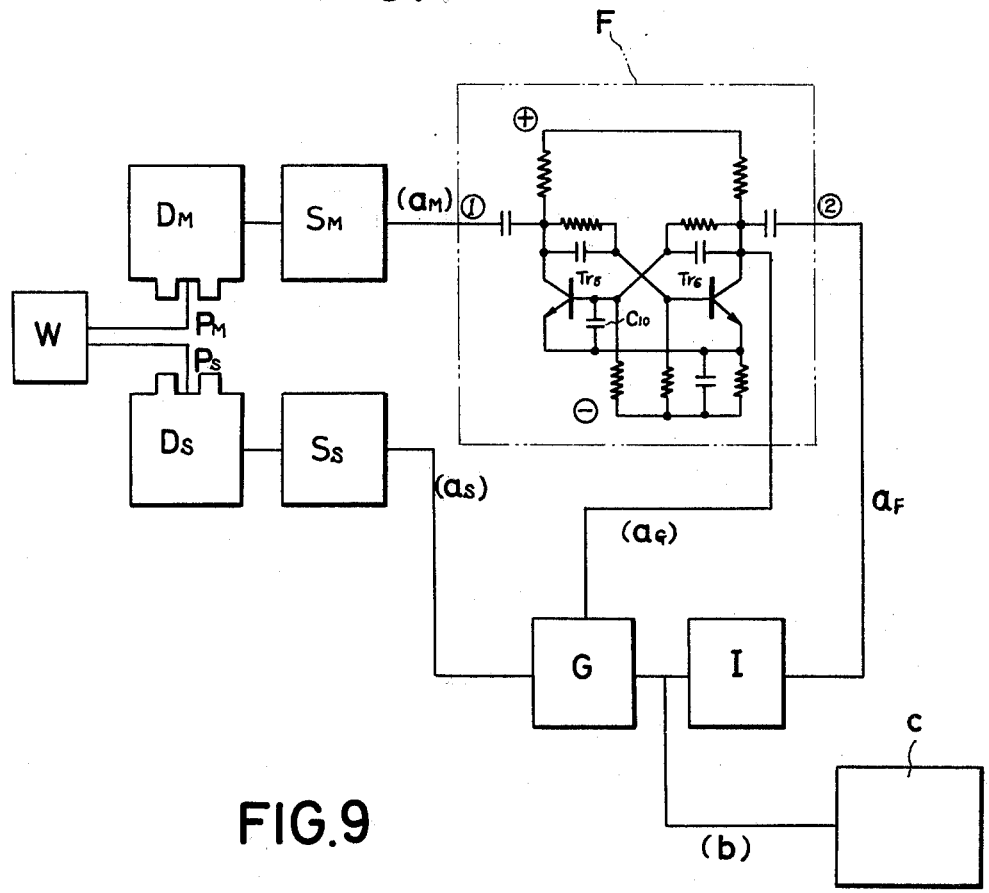
FIG. 8 shows a modified portion of the device shown in FIG. 1.
Figure 9:
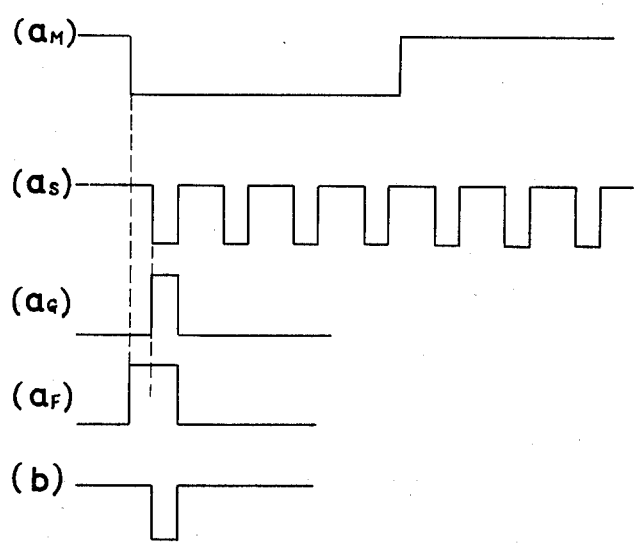
FIG. 9 shows wave forms at various points of the modified portion shown in FIG. 8.

The modified embodiment shown in FIG. 8 uses a means for increasing the detection accuracy of the detecting mean. In FIG. 8, DM and $D_s$ are respective detecting means for detecting movement of a minute hand or painter PM and the second hand or painter PS of a watch W. SM and $S_s$ are respective shaping circuits, F is a flip-flop circuit G is a gate circuit, and I is an inverting circuit. The flip-flop circuit F comprises a pair of transistors $TR_5$ and $TR_6$, and a capacitor $C_{10}$ for initial conditioning. Elements 1 and 2 are input terminals for the flip-flop circuit F. The terminal 1 and 2 receive respective signals aM and aF as shown in FIG. 9. The gate circuit G receives a signal aS in FIG. 9 and an output signal aG in FIG. 9 from the flip-flop circuit F. The output signal $b$ in FIG. 9 from the gate circuit G is supplied to a counter C as shown for example in FIG. 1.

The output $b$ from the gate is delivered to the inverting circuit 1 to restore the flip-flop circuit F to its initial condition.

Because the flip-flop circuit F includes the capacitor $C_{10}$ between the emitter and the base of the transistor $TR_5$, its initial condition is established and maintained such that transistor $Tr_5$ is in a conductive state and the transistor $TR_6$ is in a non-conductive state when activated by the power source.

This detecting circuit delivers its output b only when the first output signal As after the delivery of the output signal aM arrives at the gate circuit. Thus it is FIG. 8 represents a system for actuating the counter C in FIGS. 1 and 3 more accurately than in the latter figures.

An improved means for restoring the indicating member of the watch means to its original position will now be described in connection with FIG. 10 and FIG. 11.

This embodiment example comprises a motor 30 with a switch 38 for non-actuation of the motor 30 when the indicating members 2, 3 and 4 of the watch 1 are at their original position. When a reset lever 27 is pressed against a spring 28, in a manner shown by an arrow H, for restoring members 2, 3 and 4 from the state shown in FIG. 10, a contact edge portion 25a of a pin 25 is moved against a biasing spring 26 until the top of the edge portion 25a reaches the inner surface of a fixed of a ring member 13a through a hole 13b provided in the ring member 13a. Just then or thereafter, a micro-switch 29 closes a motor circuit. The motor 30 begins to rotate in response to a battery 31. A gear 32 fixed to the motor shaft rotates a geared pulley 33. Rotational movement of the pully 33 is delivered to a cylindrical member 11a through a belt 34, so the cylindrical member 11a rotates with the pin 25 slideably mounted on the cylindrical member 11a. During this process of the rotation, the edge portion 25a maintains contact with the inner surface of the fixed ring member 13a and a lever fixed to the pin 25 at its other end sweeps the pointers 2, 3 and 4 towards their original positions. The cylindrical member 11a has a pin 35 fixedly mounted planted thereon. A control lever 36 is biased into contact with the microswitch 38 by means of a spring 37. This control lever 36 is disengaged from the switch 38 by the pin 35 at the end of the rotation of the cylinder member 11a and at the end of the restoring movement of the cylinder member 11a. This disengagement of the lever 36 from switch 38 stop the motor 30. This restored state of the pointers 2, 3 and 4 is shown in FIG. 11.

Members 5 to 10 are similar to those shown in FIGS. 6 and 7. A plastic transparent plate 12a is fixed to a ring member 12b. A front plate 14a fixedly supports the ring member 13a. The above description has been made in case the microswitch 29 and 38 are provided with a latch which holds the circuit connection, but if a separate holding mechanism is provided outside the switch, the construction of the switch is simplified.

The pin 25 with the edge portion 25a with the spring 26 constitutes a latch together with the ring member 13a Restoration of the holding mechanism of 25, 26, 25a and 13a to the state shown in FIG. 10 is effected at the end of the restorating rotation of the cylinder member 11a as the cylinder member 11a rotates just one revolution. However, for simplification of the description, this is not shown in FIGS. 10 and 11.

What is claimed is:

1. A control device for actuating a portable machine, comprising portable timepiece means having a first indicating member which repeats one cycle of movement over one time, and a second indicating member which repeats one cycle of movement over a second time period shorter than the first time period, detecting means including a first detector for detecting each repetition of movement of the first indicator member and a second detector for detecting each repetition of movement of the second indicating member, a single retaining circuit connected to said first detector to be set thereby and to produce an electrical mark in response to the output of the first detector, a gate circuit responsive to the output of said signal retaining circuit and said second detector circuit for passing the next output from said second circuit when the signal retaining circuit is set, said signal retaining circuit being responsive to the gate circuit and being reset thereby so as to close the gate in response to passage by the gate of the first one of the outputs from said second detector after the output from the first detector, a counter coupled to the gate and responding to the output of the gate for counting a predetermined number of signals from the gate, delay means connected to the counter for selecting a predetermined number of output signals of the counter to generate a first starting signal, and to generate a second starting signal delayed by a predetermined period of time from the generation of the first starting signal, and output control means connected to said delay means and said counter for actuating a first portion of the portable machine in response to the first starting signal and actuating the second portion of the machine in response to the second starting signal.

2. A device as in claim 1, wherein said delay means further includes a time constant circuit for determining the delay time of said delay means and an element for varying the time constant.

3. A control device for actuating respective parts of a portable machine, comprising portable timepiece means having a first repetitiously moving indicating member and a second repetitiously moving indicating member which repeats one cycle of movement within a shorter period than the first indicating member, detecting means having a first detector responsive to the movement of said first indicating member and producing an output for each repetition of movement of the first indicating member and a second detector for detecting movement of said second indicating member and producing an output for each repetition of movement of said second indicating member, a pair of shaping circuits respectively connected with said first and second detectors, each of said circuits being changeable to one state in response to the output of a respective detector while being set to another state in response to the lack of output of the detector, a gate circuit connected with the output of said two shaping circuits respectively, said gate circuit producing an output signal when the two pulse circuits are in the one state and to be non-conductive when the two safety circuits are in other states, a counter connected with said gate circuit for counting the output signals emitted by said gate circuit, said counter being variable to establish a threshold for each signal to be counted by the counter, signal retaining means coupled to said threshold means for generating an output signal in response to the input signal of said threshold means, timer means for detecting the signal emitted by said signal retaining means and for generating the signal after a predetermined delay and to supply the generated signal to said signal retaining means as an input signal, said timer means being coupled to said signal retaining means, output control means connected with said signal retaining means and having actuating means to actuate the portable machine, said actuating means being responsive to the output signal emitted from said signal retaining means and for resetting said signal retaining means, whereby the action of the output of said control means is controlled due to the action of said signal retaining means.

4. A control device for actuating a portable machine, comprising portable timepiece means having a pair of moving indicating members one moving faster than the other, detecting means for detecting movement of each of said indicating members and producing an output for each repetition of movement of the slower of said indicating members, starting means responsive to each of a predetermined number of the outputs for producing a first starting signal, delay means responsive to the first starting signal for producing a second starting signal, control means responsive to each of said starting means and said delay means for actuating respective portions of the portable machine in response to each of said starting signals, said detecting means including a pair of flux forming means for forming respective flux fields and a pair of interrupting means each coupled to one of said members to move with said members each for repetitively interrupting a respective one of the flux fields in dependence upon the motion of the respective members, said detecting means further including a pair of output forming means and coupled to one of said flux forming means for producing an electrical mark indicating interruption of the one of said flux forming means by said interrupting means, one of the marks occurring more frequently than the other, gate means in said detecting means and coupled to each of said forming means for opening in response to each slower of the marks so as to permit passage of the next one of the faster of said marks to form each output and responding to the output to be closed thereby and wherein said mark forming means each includes threshold means for producing the mark when the output of said flux forming means exceeds a predetermined value, said gate means including a gate coupled to the more frequent of the marks and a memory coupled to the less frequent of the marks, said memory being connected to the gate and responding to the less frequent of the marks by opening the gate and holding it open, said gate being connected to the memory for resetting the memory in response to passage of a mark from the mark forming means generating the more frequent of the marks.

5. A control device for actuating a portable machine, comprising portable timepiece means having a pair of moving indicating members one moving faster than the other, detecting means for detecting movement of each of said indicating members and producing an output for each repetition of movement of the slower of said indicating members, starting means responsive to each of a predetermined number of the outputs for producing a first starting signal, delay means responsive to the first starting signal for producing a second starting signal, control means responsive to each of said starting means and said delay means for actuating respective portions of the portable machine in response to each of said starting signals, said detecting means including a pair of flux forming means for forming respective flux fields and a pair of interrupting means each coupled to one of said members to move with said members each for repetitively interrupting a respective one of the flux fields in dependence upon the motion of the respective members, said detecting means further including a pair of output forming means and coupled to one of said flux forming means for producing an electrical mark indicating interruption of the one of said flux forming means by said interrupting means, one of the marks occurring more frequently than the other, gate means in said detecting means and coupled to each of said forming means for opening in response to each slower of the marks so as to permit passage of the next one of the faster of said marks to form each output and responding to the output to be closed thereby, and wherein said timepiece means includes restoring means for restoring the indicating members to their original position, said restoring means further including manually operable switch means, and an electric motor actuable by closing of said switch means.

6. A control device for actuating a portable machine, comprising portable timepiece means having a pair of moving indicating members one moving faster than the other, detecting means for detecting movement of each of said indicating members and producing an output for each repetition of movement of the slower of said indicating members, starting means responsive to each of a predetermined number of the outputs for producing a first starting signal, delay means responsive to the first starting signal for producing a second starting signal, control means responsive to each of said starting means and said delay means for actuating respective portions of the portable machine in response to each of said starting signals, said detecting means including a pair of flux forming means for forming respective flux fields and a pair of interrupting means each coupled to one of said members to move with said members each for repetitively interrupting a respective one of the flux fields in dependence upon the motion of the respective members, said detecting means further including a pair of output forming means and coupled to one of said flux forming means for producing an electrical mark indicating interruption of the one of said flux forming means by said interrupting means, one of the marks occurring more frequently than the other, gate means in said detecting means and coupled to each of said forming means for opening in response to each slower of the marks so as to permit passage of the next one of the faster of said marks to form each output and responding to the output to be closed thereby and wherein said timepiece means includes restoring means for restoring the indicating members to their original position, said restoring means including a manually operable member engageable with said indicating means.

7. A control device for actuating a portable machine, comprising portable timepiece means having a pair of moving indicating members one moving faster than the other, detecting means for detecting movement of each of said indicating members and producing an output for each repetition of movement of the slower of said indicating members, starting means responsive to each of a predetermined number of the outputs for producing a first starting signal, delay means responsive to the first starting signal for producing a second starting signal, control means responsive to each of said starting means and said delay means for actuating respective portions of the portable machine in response to each of said starting signals, said detecting means including a pair of flux forming means for forming respective flux fields and a pair of interrupting means each coupled to one of said members to move with said members each for repetitively interrupting a respective one of the flux fields in dependence upon the motion of the respective members, said detecting means further including a pair of output forming means and coupled to one of said flux forming means for producing an electrical mark indicating interruption of the one of said flux forming means by said interrupting means, one of the marks occurring more frequently than the other, gate means in said detecting means and coupled to each of said forming means for opening in response to each slower of the marks so as to permit passage of the next one of the faster of said marks to form each output and responding to the output to be closed thereby, and wherein said control means also includes first and second actuating members for actuating the portable machine.

8. A control device for actuating a portable machine, comprising portable timepiece means having a pair of moving indicating members one moving faster than the other, detecting means for detecting movement of each of said indicating members and producing an output for each repetition of movement of the slower of said indicating members, starting means responsive to each of a predetermined number of the outputs for producing a first starting signal, delay means responsive to the first starting signal for producing a second starting signal, control means responsive to each of said starting means and said delay means for actuating respective portions of the portable machine in response to each of said starting signals, said detecting means including a pair of flux forming means for forming respective flux fields and a pair of interrupting means each coupled to one of said members to move with said members each for repetitively interrupting a respective one of the flux fields in dependence upon the motion of the respective members, said detecting means further including a pair of output forming means coupled to one of said flux forming means for producing an electrical mark indicating interruption of the one of said flux forming means by said interrupting means, one of the marks occurring more frequently than the other, gate means in said detecting means and coupled to each of said forming means for opening in response to each slower of the marks so as to permit passage of the next one of the faster of said marks to form each output and responding to the output to be closed thereby and wherein said timepiece means includes restoring means for restoring the indicating member to its original position and wherein said control means further includes a time constant circuit interposed between first and second actuating members, a parallel circuit having a one-way directional element and a resistor, a capacitor, said time constant circuit connecting said parallel circuit to said capacitor so that the delay in the action of the second actuating member is greater than the actuation of the first actuating member.

9. A control device for actuating a portable machine, comprising portable timepiece means having a pair of moving indicating members one moving faster than the other, detecting means for detecting movement of each of said indicating members and producing an output for each repetition of movement of the slower of said indicating members, starting means responsive to each of a predetermined number of the outputs for producing a first starting signal, delay means responsive to the first starting signal for producing a second starting signal, control means responsive to each of said starting means and said delay means for actuating respective portions of the portable machine in response to each of said starting signals, said detecting means including a pair of flux forming means for forming respective flux fields and a pair of interrupting means each coupled to one of said members to move with said members each for repetitively interrupting a respective one of the flux fields in dependence upon the motion of the respective members, said detecting means further including a pair of output forming means and coupled to one of said flux forming means for producing an electrical mark indicating interruption of the one of said flux forming means by said interrupting means, one of the marks occurring more frequently than the other, gate means in said detecting means and coupled to each of said forming means for opening in response to each slower of the marks so as to permit passage of the next one of the faster of said marks to form each output and responding to the output to be closed thereby and wherein said timepiece means includes restoring means for restoring the indicating members to their original position, said restoring means including a manual operating member engageable with said indicating members and wherein said output control means includes two actuating members and a delay circuit for providing delay timing between the actuating times of the two members.

* * * * *